(12) United States Patent
Wang et al.

(10) Patent No.: US 10,566,973 B2
(45) Date of Patent: Feb. 18, 2020

(54) SENDING, RECEIVING AND TRANSMITTING APPARATUSES OF DUAL-POWER SYSTEM AND FINGERPRINT RECOGNITION SYSTEM

(71) Applicant: FOCALTECH ELECTRONICS, LTD., Cayman Islands (KY)

(72) Inventors: Yunn-Hwa Wang, Guangdong (CN); Kuet Liong Fam, Guangdong (CN)

(73) Assignee: FOCALTECH ELECTRONICS, LTD., Grand Cayman (KY)

( * ) Notice: Subject to any disclaimer, the term of this patent is extended or adjusted under 35 U.S.C. 154(b) by 413 days.

(21) Appl. No.: 15/661,619

(22) Filed: Jul. 27, 2017

(65) Prior Publication Data

US 2018/0041211 A1 Feb. 8, 2018

(30) Foreign Application Priority Data

Aug. 5, 2016 (CN) .......................... 2016 1 0639236

(51) Int. Cl.
| | | |
|---|---|---|
| *G01R 19/10* | (2006.01) | |
| *H03K 19/00* | (2006.01) | |
| *G06K 9/00* | (2006.01) | |
| *H03K 19/0948* | (2006.01) | |
| *G01R 19/165* | (2006.01) | |

(52) U.S. Cl.
CPC ......... *H03K 19/0027* (2013.01); *G01R 19/10* (2013.01); *G06K 9/00053* (2013.01); *H03K 19/0948* (2013.01); *G01R 19/1659* (2013.01); *G06K 9/00006* (2013.01)

(58) Field of Classification Search
USPC .......................................................... 307/80
See application file for complete search history.

(56) References Cited

U.S. PATENT DOCUMENTS

| | | | |
|---|---|---|---|
| 7,049,865 B2* | 5/2006 | Parker .................. | H03K 17/223 327/143 |
| 2008/0191747 A1* | 8/2008 | Konmoto ......... | H03K 19/00369 327/63 |

* cited by examiner

*Primary Examiner* — Danny Nguyen
(74) *Attorney, Agent, or Firm* — Yue (Robert) Xu; Apex Attorneys at Law, LLP

(57) ABSTRACT

Sending, receiving and transmitting apparatuses of a dual-power system and a fingerprint recognition system are provided. The dual-power system includes a first power system for providing a first high voltage signal and a first low voltage signal and a second power system for providing a second high voltage signal and a second low voltage signal, and a voltage difference between the first high voltage signal and the first low voltage signal is equal to that between the second high voltage signal and the second low voltage signal. The sending apparatus includes a first detection circuit for outputting a detection signal indicating whether voltages of the first and second low voltage signals are equal; and a first transmission circuit for transmitting an output signal of the dual-power system or provide a first voltage to an output terminal of the sending apparatus, based on the detection signal.

24 Claims, 8 Drawing Sheets

SENDING, RECEIVING AND TRANSMITTING APPARATUSES OF DUAL-POWER SYSTEM AND FINGERPRINT RECOGNITION SYSTEM

CROSS REFERENCE TO RELATED APPLICATIONS

This application claims priority to Chinese Patent Application No. 201610639236.9, titled "SENDING, RECEIVING AND TRANSMITTING APPARATUSES OF DUAL-POWER SYSTEM AND FINGERPRINT RECOGNITION SYSTEM", filed with the Chinese State Intellectual Property Office on Aug. 5, 2016, which is incorporated by reference in its entirety herein.

TECHNICAL FIELD

The present disclosure relates to the field of circuit, and in particular to sending, receiving and transmitting apparatuses of a dual-power system and a fingerprint recognition system.

BACKGROUND

An early fingerprint recognition system is provided with a ring. A radio-frequency (RF) signal is applied on the ring and detected by a sensor, and the radio-frequency signal may be distort due to applying of a fingerprint. If a thickness of encapsulation needs to be increased, the amplitude of the radio-frequency signal also needs to be increased. However, the increase of the amplitude of the radio-frequency signal may make a user feel uncomfortable on the finger. Therefore, a technical solution in the conventional technology is by grounding the ring and improving a voltage of a sensor chip, thereby, alleviating the problem of poor tactile experience of a finger and achieving the same technical effect with applying a radio-frequency signal on a ring.

In order to achieve the above object, some circuits in a sensor chip need to operate at two different ground potentials, such as a first ground voltage GND and a second ground voltage NGND. In most cases, the first ground voltage GND is equal to the second ground voltage NGND. However, the second ground voltage NGND is increased when detecting a fingerprint, and the increase of the second ground voltage NGND will cause a high voltage potential to increase correspondingly.

When the sensor chip is connected to other circuits to transmit a signal, increasing of the voltages as described above tends to cause a breakdown of the connected circuits.

SUMMARY

The present disclosure is to solve the problem that circuits connected to a sensor chip are easily damaged when a supply voltage of the sensor chip increases.

To solve the above problem, a sending apparatus of a dual-power system is provided according to the present disclosure. The dual-power system includes: a first power system and a second power system, where the first power system is configured to provide a first high voltage signal and a first low voltage signal, the second power system is configured to provide a second high voltage signal and a second low voltage signal, and a voltage difference between the first high voltage signal and the first low voltage signal is equal to that between the second high voltage signal and the second low voltage signal. The sending apparatus includes:

a first detection circuit, configured to output a detection signal, where the detection signal indicates whether a voltage of the first low voltage signal is equal to that of the second low voltage signal, or whether a voltage of the first high voltage signal is equal to that of the second high voltage signal; and a first transmission circuit, configured to transmit an output signal of the dual-power system to an output terminal of the sending apparatus or provide a first voltage to the output terminal of the sending apparatus, based on the detection signal.

A receiving apparatus of a dual-power system is further provided according to the present disclosure. The dual-power system includes: a first power system and a second power system, where the first power system is configured to provide a first high voltage signal and a first low voltage signal, the second power system is configured to provide a second high voltage signal and a second low voltage signal, and a voltage difference between the first high voltage signal and the first low voltage signal is equal to that between the second high voltage signal and the second low voltage signal. The receiving apparatus includes:

a second detection circuit, configured to output a detection signal, where the detection signal indicates whether a voltage of the first low voltage signal is equal to that of the second low voltage signal, or whether a voltage of the first high voltage signal is equal to that of the second high voltage signal; and a second transmission circuit, configured to transmit an input signal of the dual-power system to an output terminal of the receiving apparatus or provide a second voltage to the output terminal of the receiving apparatus, based on the detection signal.

A transmitting apparatus of a dual-power system is further provided according to the present disclosure, which includes one or more receiving systems and the above sending apparatus. Each of the one or more receiving systems is connected to the output terminal of the sending apparatus, and a supply voltage of each of the one or more receiving systems is higher than or equal to the first voltage.

Another transmitting apparatus of a dual-power system is further provided according to the present disclosure, which includes one or more sending systems and the above receiving apparatus. Each of the one or more sending systems is configured to provide an input signal of the dual-power system.

A fingerprint recognition system is further provided according to the present disclosure, which includes a dual-power system and the above transmitting apparatus. The dual-power system is configured to provide an output signal of the dual-power system to the input terminal of the sending apparatus.

Another fingerprint recognition system is further provided according to the present disclosure, which includes a dual-power system and the above transmitting apparatus. The dual-power system is connected to the output terminal of the receiving apparatus.

Compared with the conventional technology, in a case that a supply voltage is increased, the sending apparatus or the receiving apparatus according to the technical solutions of the present disclosure plays a role of isolation and blocks a connection of a dual-power system and other circuits, thereby, preventing other circuits connected to the dual-power system from being damaged.

DETAILED DESCRIPTION OF THE EMBODIMENTS

To make the above objects, features and advantages of the present disclosure clearer and easier to understand, hereinafter specific embodiments of the present disclosure are described in detail in conjunction with the drawings.

Figure 1:
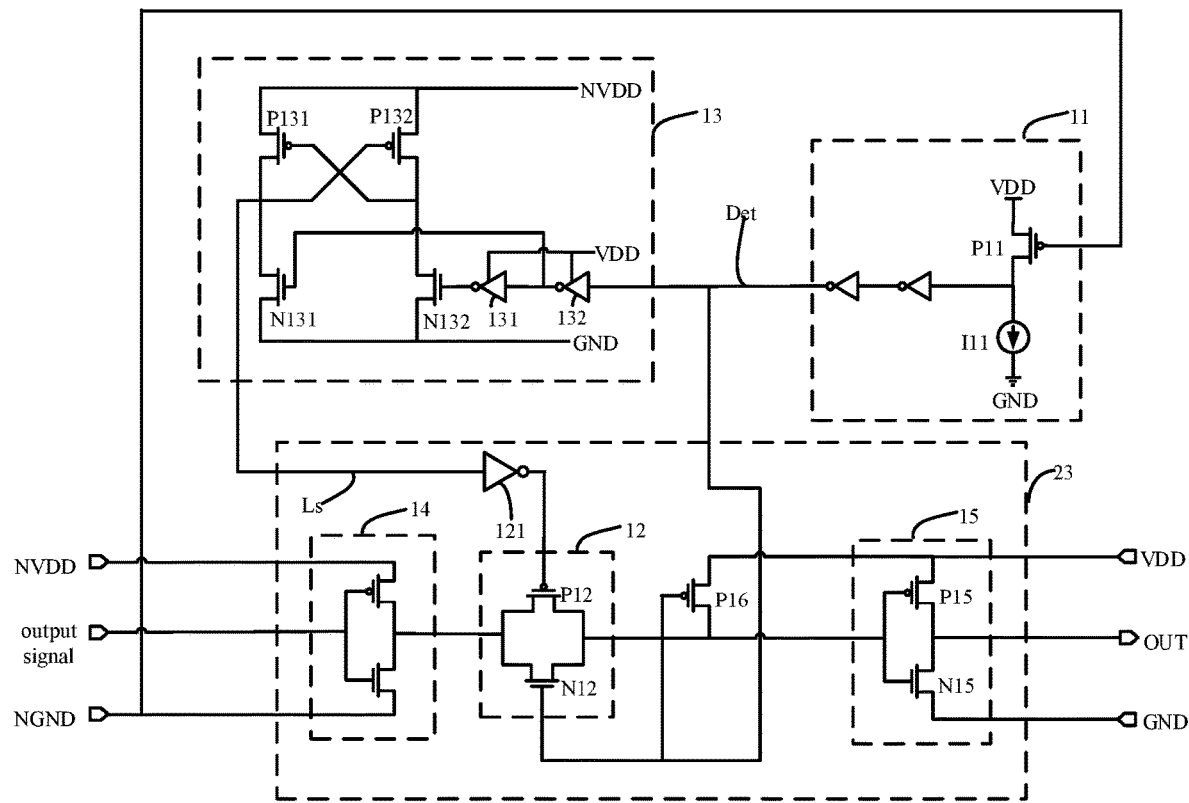
FIG. 1 is a schematic structural diagram of a sending apparatus in a positive voltage mode according to the present disclosure.

As shown in FIG. 1, a sending apparatus for a positive voltage mode is provided according to an embodiment. The positive voltage mode refers to a mode in which a second high voltage signal NVDD and a second low voltage signal NGND each are a positive voltage signal all the time.

A dual-power system includes a first power system and a second power system. The first power system is configured to provide a first high voltage signal VDD and a first low voltage signal GND, and the second power system is configured to provide a second high voltage signal NVDD and a second low voltage signal NGND. A voltage difference between the first high voltage signal VDD and the first low voltage signal GND is equal to that between the second high voltage signal NVDD and the second low voltage signal NGND. A dual-power system in the following embodiments is the same as the one in the embodiment, which will not be descried redundantly therein.

The dual-power system according to the embodiment is configured to provide an output signal to the sending apparatus. The sending apparatus includes a first detection circuit 11 and a first transmission circuit 23.

The first detection circuit 11 is configured to output a detection signal Det. The detection signal Det indicates whether a voltage of the first low voltage signal GND is equal to that of the second low voltage signal NGND, or whether a voltage of the first high voltage signal VDD is equal to that of the second high voltage signal NVDD.

The first transmission circuit 23 is configured to transmit an output signal of the dual-power system to an output terminal OUT of the sending apparatus or provide a first voltage to the output terminal OUT of the sending apparatus, based on the detection signal Det. The first voltage may be equal to the voltage of the first low voltage signal GND.

Specifically, in a case that the detection signal Det is a high level "1", it is indicated that the voltage of the first low voltage signal GND is equal to that of the second low voltage signal NGND, or the voltage of the first high voltage signal VDD is equal to that of the second high voltage signal NVDD; and in a case that the detection signal Det is a low level "0", it is indicated that the voltage of the first low voltage signal GND is not equal to that of the second low voltage signal NGND, or the voltage of the first high voltage signal VDD is not equal to that of the second high voltage signal NVDD. In a case that the voltage of the first low voltage signal GND is equal to that of the second low voltage signal NGND or the voltage of the first high voltage signal VDD is equal to that of the second high voltage signal NVDD, the output signal of the dual-power system is transmitted to the output terminal OUT of the sending apparatus. In a case that the voltage of the first low voltage signal GND is not equal to that of the second low voltage signal VGND or the voltage of the first high voltage signal VDD is not equal to that of the second high voltage signal NVDD, the first voltage is provided to the output terminal OUT of the sending apparatus.

Figure 2:
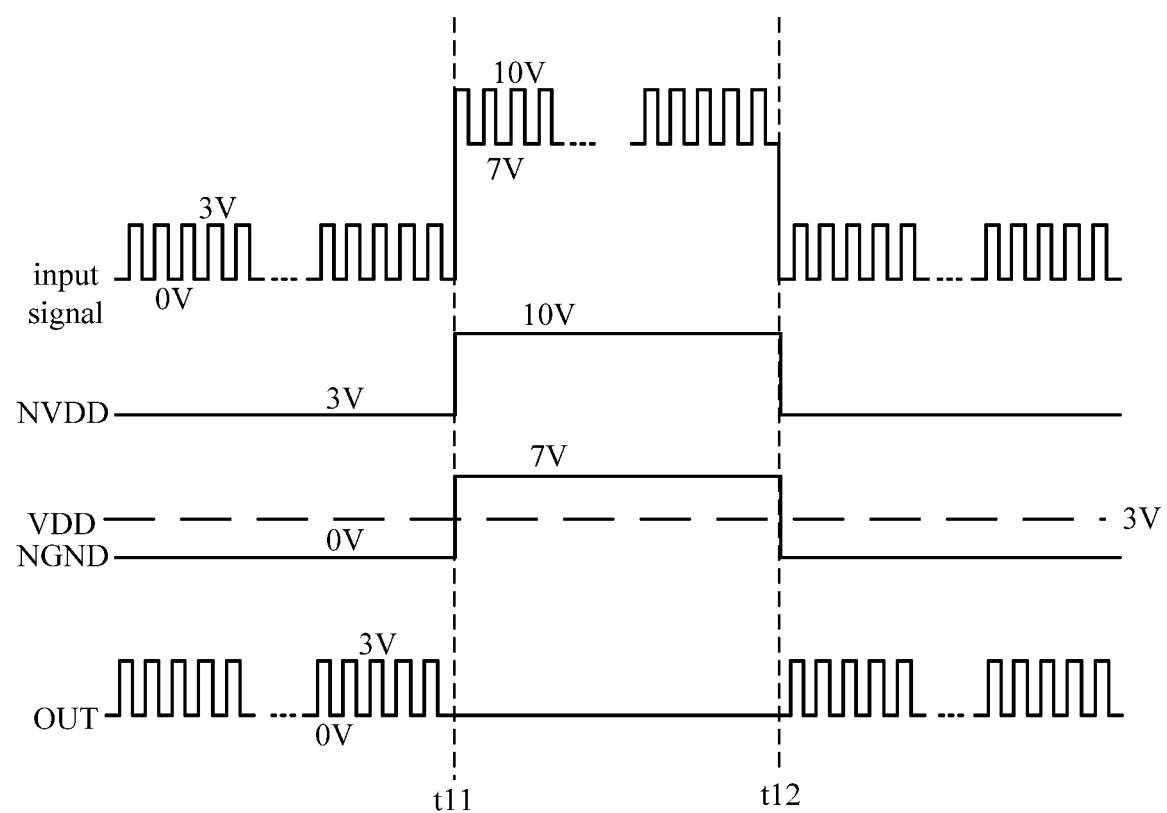
FIG. 2 is a waveform diagram of the structure in FIG. 1.

As shown in FIG. 2, before the instant t11 or after the instant t12, both the voltages of the second low voltage signal NGND and the first low voltage signal GND are 0V and are lower than that of the first high voltage signal VDD which is 3V. Between the instant t11 and the instant t12, the voltage of the second low voltage signal NGND is increased to 7V, and the voltage of the second high voltage signal is increased to 10V from 3V accordingly. In this case, the voltage of the second low voltage signal NGND is higher than that of the first high voltage signal VDD and not equal to that of the first low voltage signal GND which is 0V.

It can be seen from the above timing analysis whether the voltage of the second low voltage signal NGND is equal to that of the first low voltage signal GND may be determined according to whether the voltage of the second low voltage signal NGND is higher than that of the first high voltage signal VDD. Accordingly, the first detection circuit 11 in the embodiment includes a first detection PMOS (p-type metal oxide semiconductor) transistor P11 and a first current source I11.

The source of the first detection PMOS transistor P11 receives the first high voltage signal VDD. The gate of the first detection PMOS transistor P11 receives the second low voltage signal NGND. The drain of the first detection PMOS transistor P11 is connected to a first terminal of the first current source I11 and outputs the detection signal Det. A second terminal of the first current source I11 receives the first low voltage signal GND.

The first transmission circuit 23 includes a first transmission gate 12, a first bias PMOS transistor P16 and a first transmission inverter 121.

A first control terminal of the first transmission gate 12 receives the detection signal Det. A second control terminal of the first transmission gate 12 is connected to an output terminal of the first transmission inverter 121. An input terminal of the first transmission gate 12 receives the output signal. An output terminal of the first transmission gate 12 is connected to the drain of the first bias PMOS transistor P16. The gate of the first bias PMOS transistor P16 receives the detection signal Det. The source of the first bias PMOS transistor P16 receives the first high voltage signal VDD. The drain of the first bias PMOS transistor P16 is connected to the output terminal OUT of the sending apparatus.

An input terminal of the first transmission inverter 121 may directly receive the detection signal Det (not shown in the figure). The input terminal of the first transmission inverter 121 may also receive the detection signal Det via a first boost circuit 13, thereby, ensuring the first transmission gate 12 to be turn on or off effectively. The first boost circuit 13 will be described in detail hereinafter.

The first transmission gate 12 in the sending apparatus for a positive voltage mode may include a first transmission PMOS transistor P12 and a first transmission NMOS (n-type metal oxide semiconductor) transistor N12.

The source of the first transmission PMOS transistor P12 is connected to the drain of the first transmission NMOS transistor N12 and functions as the input terminal of the first transmission gate 12. The drain of the first transmission PMOS transistor P12 is connected to the source of the first transmission NMOS transistor N12 and functions as the output terminal of the first transmission gate 12. The gate of the first transmission NMOS transistor N12 functions as the first control terminal of the first transmission gate 12, and the gate of the first transmission PMOS transistor P12 functions as the second control terminal of the first transmission gate 12.

The first transmission circuit 23 may further include a first input inverter 14 and a first output inverter 15.

The input terminal of the first transmission gate 12 receives the output signal of the dual-power system via the first input inverter 14. The output terminal of the first transmission gate 12 is connected to the drain of the first bias PMOS transistor P16 and further connected to the output terminal OUT of the sending apparatus via the first output inverter 15.

The first boost circuit 13 is configured to process the detection signal Det. The input terminal of the first transmission inverter 121 receives a detection signal Ls which has been processed by the first boost circuit.

The first boost circuit 13 may include a first boost PMOS transistor P131, a second boost PMOS transistor P132, a first boost NMOS transistor N131, a second boost NMOS transistor N132, a first boost inverter 131 and a second boost inverter 132.

Both the sources of the first boost PMOS transistor P131 and the second boost PMOS transistor P132 receive the second high voltage signal NVDD. Both the sources of the first boost NMOS transistor N131 and the second boost NMOS transistor N132 receive the first low voltage signal GND.

The gate of the first boost PMOS transistor P131 is connected to the drain of the second boost PMOS transistor P132 and the drain of the second boost NMOS transistor N132. The drain of the first boost PMOS transistor P131 is connected to the gate of the second boost PMOS transistor P132 and the drain of the first boost NMOS transistor N131, and outputs the detection signal Ls which has been processed by the first boost circuit 13.

The gate of the first boost NMOS transistor N131 is connected to an input terminal of the first boost inverter 131 and an output terminal of the second boost inverter 132. The gate of the second boost inverter 132 is connected to an output terminal of the first boost inverter 131.

Both supply terminals of the first boost inverter 131 and the second boost inverter 132 receive the first high voltage signal VDD. An input terminal of the second boost inverter 132 receives the detection signal Det.

Operating processes of the sending apparatus for a positive voltage mode are described in the following.

In a case that the voltage of the second low voltage signal NGND is lower than that of the first high voltage signal VDD, the first detection PMOS transistor P11 is turned on, and the detection signal Det outputted by the first detection circuit 11 is a high level "1" having a voltage equal to that of the first high voltage signal VDD, which indicates that the voltage of the second low voltage signal NGND is equal to that of the first low voltage signal GND.

The detection signal Det causes the first transmission NMOS transistor N12 in the first transmission gate 12 to be turned on, the first bias PMOS transistor P16 to be turned off, the first boost NMOS transistor N131 in the first boost circuit 13 to be turned off, the second boost PMOS transistor P132 in the first boost circuit 13 to be turned off, and the second boost NMOS transistor N132 in the first boost circuit 13 to be turned on. Thus, a gate voltage of the first boost PMOS transistor P131 is equal to the voltage of the first low voltage signal GND, whereby the first boost PMOS transistor P131 is turned on and a voltage of the detection signal Ls which has been processed by the first boost circuit 13 is equal to that of the second high voltage signal NVDD.

The detection signal Ls which has been processed by the first boost circuit 13 causes the first transmission PMOS transistor P12 in the first transmission gate 12 to be turned on. Since the first transmission PMOS transistor P12 and the first transmission NMOS transistor N12 in the first transmission gate 12 are in the on state, the first transmission gate 12 transmits the output signal of the dual-power system to the output terminal OUT of the sending apparatus.

In a case that the voltage of the second low voltage signal NGND is higher than or equal to that of the first high voltage signal VDD, the first detection PMOS transistor P11 is turned off, and the detection signal Det outputted by the first detection circuit 11 is a low level "0" having a voltage equal to that of the first low voltage signal GND, which indicates that the voltage of the second low voltage signal NGND is not equal to that of the first low voltage signal GND.

The detection signal Det causes the first transmission NMOS transistor N12 in the first transmission gate 12 to be turned off, the first bias PMOS transistor P16 to be turned on, the second boost NMOS transistor N132 in the first boost circuit to be turned off, the first boost PMOS transistor P131 in the first boost circuit to be turned off, and the first boost NMOS transistor N131 in the first boost circuit to be turned on. Thus, a voltage of the detection signal Ls which has been processed by the first boost circuit 13 is equal to that of the first low voltage signal GND.

The detection signal Ls which has been processed by the first boost circuit 13 causes the first transmission PMOS transistor P12 in the first transmission gate 12 to be turned off. Since the first transmission PMOS transistor P12 and the first transmission NMOS transistor N12 in the first transmission gate 12 are in the off state, and the first bias PMOS transistor P16 is in the on state, a voltage of the output terminal of the first transmission gate 12 is equal to that of the first high voltage signal VDD. Thus, the NMOS transistor N15 in the first output inverter 15 is turned on and the PMOS transistor P15 in the first output inverter 15 is turned off, and the voltage of the output terminal OUT of the sending apparatus is equal to that of the first low voltage signal GND, that is, the first voltage provided by the first transmission circuit 23 is equal to the voltage of the first low voltage signal GND.

Reference is made to FIG. 2. Before the instant t11 or after the instant t12, the voltage of the second low voltage signal NGND is equal to that of the first low voltage signal GND, and a signal of the output terminal OUT of the sending apparatus is the same as the output signal of the dual-power system. Between the instant t11 and the instant t12, the voltage of the second low voltage signal NGND is not equal to that of the first low voltage signal GND, and the voltage of the signal of the output terminal OUT of the sending apparatus is equal to that of the first low voltage signal GND.

The above sending apparatus of the dual-power system may be connected to one or more receiving systems, and the one or more receiving systems each may be a single-power system. Specifically, the one or more receiving system are connected to the output terminal OUT of the sending apparatus, and a supply voltage of each of the one or more receiving systems is higher than or equal to the first voltage. The one or more receiving systems each may include a third power system, and the third power system is configured to provide a third high voltage signal and a third low voltage signal. A voltage difference between the third high voltage signal and the third low voltage signal is equal to that between the first high voltage signal VDD and the first low voltage signal GND, a voltage of the third high voltage signal is equal to that of the first high voltage signal VDD and the first voltage is equal to the voltage of the first low voltage signal GND.

It can be seen from the above that, in a case that the voltage of the second low voltage signal NGND is increased, the sending apparatus according to the embodiment plays a role of isolation, and blocks the one or more receiving systems from the dual-power system, thereby, preventing the one or more receiving systems from being damaged.

In addition, in the embodiment, the first detection circuit 11 may further include two inverters connected in series (which are shown but not identified in FIG. 1), and the detection signal is processed by the two inverters connected in series and then outputted, which may also be applied in the following embodiments and will not be described redundantly therein.

Figure 3:
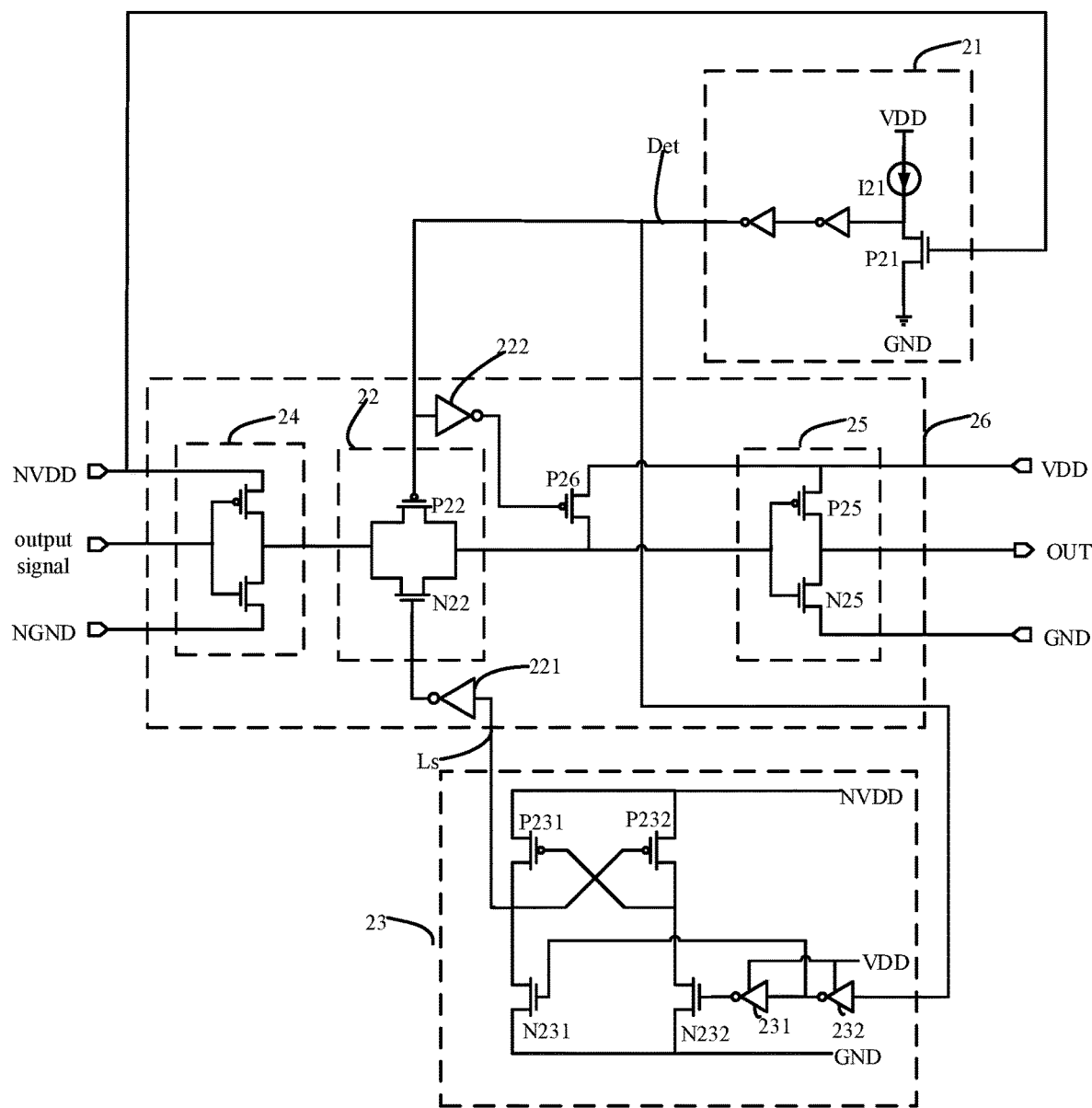
FIG. 3 is a schematic structural diagram of a sending apparatus in a negative voltage mode according to the present disclosure.

As shown in FIG. 3, a sending apparatus for a negative voltage mode is provided in the following according to an embodiment. The negative voltage mode refers to a mode in which a second high voltage signal NVDD includes a positive voltage signal and a negative voltage signal.

A dual-power system in the embodiment is configured to provide an output signal to the sending apparatus. The structure of the sending apparatus for a negative voltage mode in the embodiment is similar to that of the sending apparatus for a positive voltage mode in the previous embodiment, which includes a first detection circuit 21 and a first transmission circuit 26.

The first detection circuit 21 is configured to output a detection signal Det. The detection signal Det indicates whether a voltage of the first low voltage signal GND is equal to that of the second low voltage signal NGND, or whether a voltage of the first high voltage signal VDD is equal to that of the second high voltage signal NVDD.

The first transmission circuit 26 is configured to transmit an output signal of the dual-power system to an output terminal OUT of the sending apparatus or provide a first voltage to the output terminal OUT of the sending apparatus, based on the detection signal Det. The first voltage may be equal to the voltage of the first low voltage signal GND.

Specifically, in a case that the detection signal Det is a high level "1", it is indicated that the voltage of the first low voltage signal GND is equal to that of the second low voltage signal NGND, or the voltage of the first high voltage signal VDD is equal to that of the second high voltage signal NVDD; and in a case that the detection signal Det is a low level "0", it is indicated that the voltage of the first low voltage signal GND is not equal to that of the second low voltage signal NGND, or the voltage of the first high voltage signal VDD is not equal to that of the second high voltage signal NVDD.

In a case that the voltage of the first low voltage signal GND is equal to that of the second low voltage signal VGND or the voltage of the first high voltage signal VDD is equal to that of the second high voltage signal NVDD, the output signal of the dual-power system is transmitted to the output terminal OUT of the sending apparatus. In a case that the voltage of the first low voltage signal GND is not equal to that of the second low voltage signal VGND or the voltage of the first high voltage signal VDD is not equal to that of the second high voltage signal NVDD, the first voltage is provided to the output terminal OUT of the sending apparatus.

Figure 4:
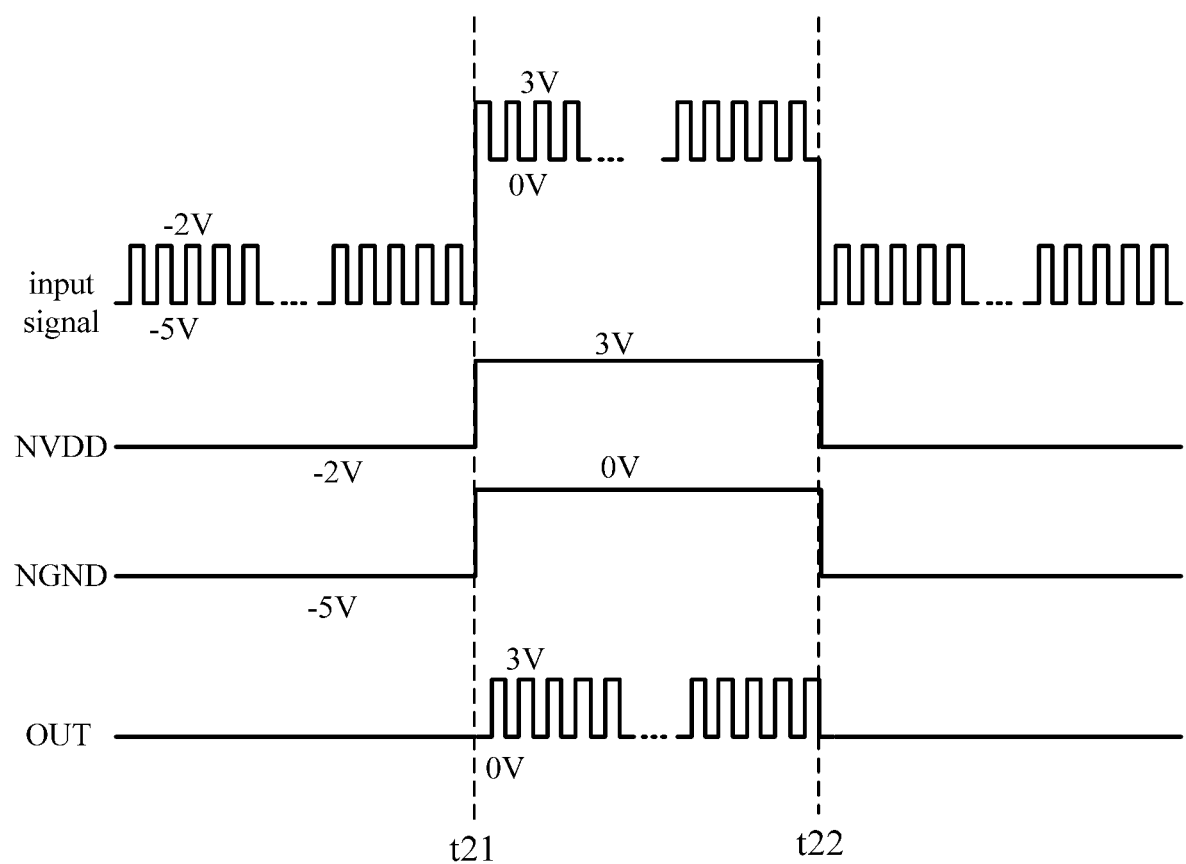
FIG. 4 is a waveform diagram of the structure in FIG. 3.

As shown in FIG. 4, between the instant t21 and the instant t22, both the voltages of the second low voltage signal NGND and the first low voltage signal GND are 0V, and the voltage of the second high voltage signal NVDD which is 3V is higher than that of the first low voltage signal GND which is 0V. Before the instant t21 or after the instant t22, the voltage of the second low voltage signal NGND is reduced to −5V, and is not equal to that of the first low voltage signal GND which is 0V, and correspondingly, the voltage of the second high voltage signal is reduced to −2V from 3V. In this case, the voltage of the second high voltage signal NVDD which is −2V is lower than that of the first low voltage signal GND which is 0V.

It can be seen from the above timing analysis whether the voltage of the second low voltage signal NGND is equal to that of the first low voltage signal GND may be determined according to whether the voltage of the second high voltage signal NVDD is higher than that of the first low voltage signal GND. Accordingly, the first detection circuit 21 in the embodiment includes a second detection NMOS transistor N21 and a second current source I21.

A first terminal of the second current source I21 receives the first high voltage signal VDD, and a second terminal of the second current source I21 is connected to the drain of the second detection NMOS transistor N21 and outputs the detection signal Det. The gate of the second detection NMOS transistor N21 receives the second high voltage signal NVDD, and the source of the second detection NMOS transistor N21 receives the first low voltage signal GND.

The first transmission circuit 26 includes a first transmission gate 22, a first bias PMOS transistor P26 and a first transmission inverter 221.

A first control terminal of the first transmission gate 22 receives the detection signal Det. A second control terminal of the first transmission gate 22 is connected to an output terminal of the first transmission inverter 221. An input terminal of the first transmission gate 22 receives the output signal of the dual-power system. An output terminal of the first transmission gate 22 is connected to the drain of the first bias PMOS transistor P26.

The gate of the first bias PMOS transistor P26 receives an inversion signal of the detection signal Det. Phase inverting of the detection signal Det is performed by an inverter 222 in the embodiment. The source of the first bias PMOS transistor P26 receives the first high voltage signal VDD. The drain of the first bias PMOS transistor P26 is connected to the output terminal OUT of the sending apparatus.

An input terminal of the first transmission inverter 221 receives the detection signal Det (not shown in the figure). The input terminal of the first transmission inverter 221 may also receive the detection signal Det via a first boost circuit 23, thereby, ensuring the first transmission gate 22 to be turn on or off effectively. The first boost circuit 23 will be described in detail hereinafter.

The first transmission gate 22 in the sending apparatus for a negative voltage mode may include a first transmission PMOS transistor P22 and a first transmission NMOS transistor N22.

The source of the first transmission PMOS transistor P22 is connected to the drain of the first transmission NMOS transistor N22 and functions as the input terminal of the first transmission gate 22. The drain of the first transmission PMOS transistor P22 is connected to the source of the first transmission NMOS transistor N22 and functions as the output terminal of the first transmission gate 22. The gate of the first transmission PMOS transistor P22 functions as the first control terminal of the first transmission gate 22, and the gate of the first transmission NMOS transistor N22 functions as the second control terminal of the first transmission gate 22.

The first transmission circuit 26 may further include a first input inverter 24 and a first output inverter 25.

The input terminal of the first transmission gate 22 receives the output signal of the dual-power system via the first input inverter 24. The output terminal of the first transmission gate 22 is connected to the drain of the first bias PMOS transistor P26 and further connected to the output terminal OUT of the sending apparatus via the first output inverter 25.

The first boost circuit 23 is configured to process the detection signal Det. The input terminal of the first transmission inverter 221 receives a detection signal Ls which has been processed by the first boost circuit 23.

The first boost circuit 23 may include a first boost PMOS transistor P231, a second boost PMOS transistor P232, a first boost NMOS transistor N231, a second boost NMOS transistor N232, a first boost inverter 231 and a second boost inverter 232. The structure of the first boost circuit 23 is the same as that of the first boost circuit 13 in the previous embodiment, and reference can be made to FIG. 3 and the corresponding section in the previous embodiment for detailed description.

Operating processes of the sending apparatus for a negative voltage mode are described in the following.

In a case that the voltage of the second high voltage signal NVDD is lower than that of the first low voltage signal GND, the second detection PMOS transistor P21 is turned off, the detection signal Det outputted by the first detection circuit 21 is a high level "1" having a voltage equal to that of the first high voltage signal VDD, which indicates that the voltage of the second low voltage signal NGND is not equal to that of the first low voltage signal GND.

The detection signal Det causes the first transmission PMOS transistor P22 in the first transmission gate 22 to be turned off, the first bias PMOS transistor P26 to be turned on, the second boost NMOS transistor N232 in the first boost circuit 23 to be turned on, the first boost PMOS transistor P231 in the first boost circuit 23 to be turned on, the first boost NMOS transistor N231 in the first boost circuit 23 to be turned off, and the second boost PMOS transistor P232 in the first boost circuit 23 to be turned off. Thus, a voltage of the detection signal Ls which has been processed by the first boost circuit 23 is equal to that of the second high voltage signal NVDD The detection signal Ls which has been processed by the first boost circuit 23 causes the first transmission NMOS transistor N22 in the first transmission gate 22 to be turned off. Since the first transmission PMOS transistor P22 and the first transmission NMOS transistor N22 in the first transmission gate 22 are in the off state and the first bias PMOS transistor P26 is in the on state, a voltage of the output terminal of the first transmission gate 22 is equal to that of the first high voltage signal VDD. Thus, an NMOS transistor N25 in the first output inverter 25 is turned on and a PMOS transistor P25 in the first output inverter 25 is turned off, and the voltage of the output terminal OUT of the sending apparatus is equal to that of the first low voltage signal GND, that is, the first voltage provided by the first transmission circuit 26 is equal to the voltage of the first low voltage signal GND.

In a case that the voltage of the second high voltage signal NVDD is higher than that of the first low voltage signal GND, the second detection PMOS transistor P21 is turned on, the detection signal Det outputted by the first detection circuit 21 is a low level "0" having a voltage equal to that of the first low voltage signal GND, which indicates that the voltage of the second low voltage signal NGND is equal to that of the first low voltage signal GND.

The detection signal Det causes the second transmission PMOS transistor P22 in the first transmission gate 22 to be turned off, the first bias PMOS transistor P26 to be turned off, the second boost NMOS transistor N232 in the first boost circuit 23 to be turned off, the first boost PMOS transistor P231 in the first boost circuit 23 to be turned off, and the first boost NMOS transistor N231 in the first boost circuit 23 to be turned on. Thus, a voltage of a detection signal Ls which has been processed by the first boost circuit 23 is equal to that of the first low voltage signal GND.

The detection signal Ls which has been processed by the first boost circuit 23 causes the first transmission NMOS transistor N22 in the first transmission gate 22 to be turned on. Since the first transmission PMOS transistor P22 and the first transmission NMOS transistor N22 in the first transmission gate 22 are in the on state, the first transmission gate 22 transmits the output signal of the dual-power system to the output terminal OUT of the sending apparatus.

Reference is made to FIG. 4. Between the instant t21 and the instant t22, the voltage of the second low voltage signal NGND is equal to that of the first low voltage signal GND, and a signal of the output terminal OUT of the sending apparatus is the same as the output signal. Before the instant t11 or after the instant t22, the voltage of the second low voltage signal NGND is not equal to that of the first low voltage signal GND, and a voltage of the signal of the output terminal OUT of the sending apparatus is equal to that of the first low voltage signal GND.

Similar to the previous embodiment, the sending apparatus in the embodiment may also be connected to one or more single-power receiving systems. In a case that the second low voltage signal NGND is increased (the absolute value of voltage is increased), the sending apparatus in the embodiment plays a role of isolation, and blocks the one or more single-power receiving systems from the dual-power system, thereby, preventing the one or more single-power receiving systems from being damaged.

Figure 5:
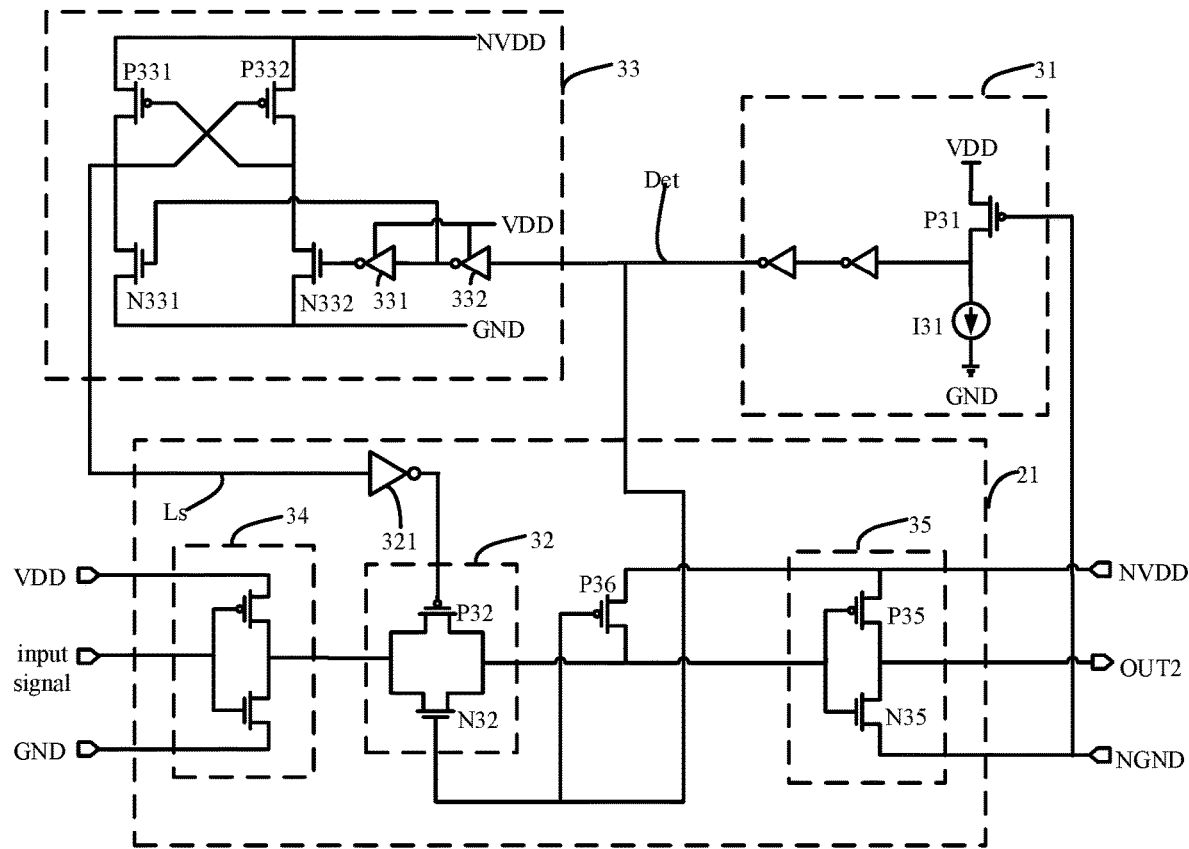
FIG. 5 is a schematic structural diagram of a receiving apparatus in a positive voltage mode according to the present disclosure.

As shown in FIG. 5, a receiving apparatus for a positive voltage mode is provided according to an embodiment. The positive voltage mode refers to a mode in which a second high voltage signal NVDD and a second low voltage signal NGND each are a positive voltage signal all the time.

A dual-power system in the embodiment is connected to an output terminal OUT2 of the receiving apparatus. The receiving apparatus includes a second detection circuit 31 and a second transmission circuit 21.

The second detection circuit 31 is configured to output a detection signal Det. The detection signal Det indicates whether a voltage of a first low voltage signal GND is equal to that of the second low voltage signal NGND, or whether a voltage of a first high voltage signal VDD is equal to that of the second high voltage signal NVDD.

The second transmission circuit 21 is configured to transmit an input signal of the dual-power system to the output terminal OUT2 of the receiving apparatus or provide a second voltage to the output terminal OUT2 of the receiving apparatus, based on the detection signal Det. The second voltage may be equal to the voltage of the second low voltage signal NGND.

Specifically, in a case that the detection signal Det is a high level "1", it is indicated that the voltage of the first low voltage signal GND is equal to that of the second low voltage signal NGND, or the voltage of the first high voltage signal VDD is equal to that of the second high voltage signal NVDD; and in a case that the detection signal Det is a low level "0", it is indicated that the voltage of the first low voltage signal GND is not equal to that of the second low voltage signal NGND, or the voltage of the first high voltage signal VDD is not equal to that of the second high voltage signal NVDD.

In a case that the voltage of the first low voltage signal GND is equal to that of the second low voltage signal VGND, or the voltage of the first high voltage signal VDD is equal to that of the second high voltage signal NVDD, the input signal is transmitted to the output terminal OUT2 of the receiving apparatus. In a case that the voltage of the first low voltage signal GND is not equal to that of the second low voltage signal VGND, or the voltage of the first high voltage signal VDD is not equal to that of the second high voltage signal NVDD, the second voltage is provided to the output terminal OUT2 of the receiving apparatus.

Figure 6:
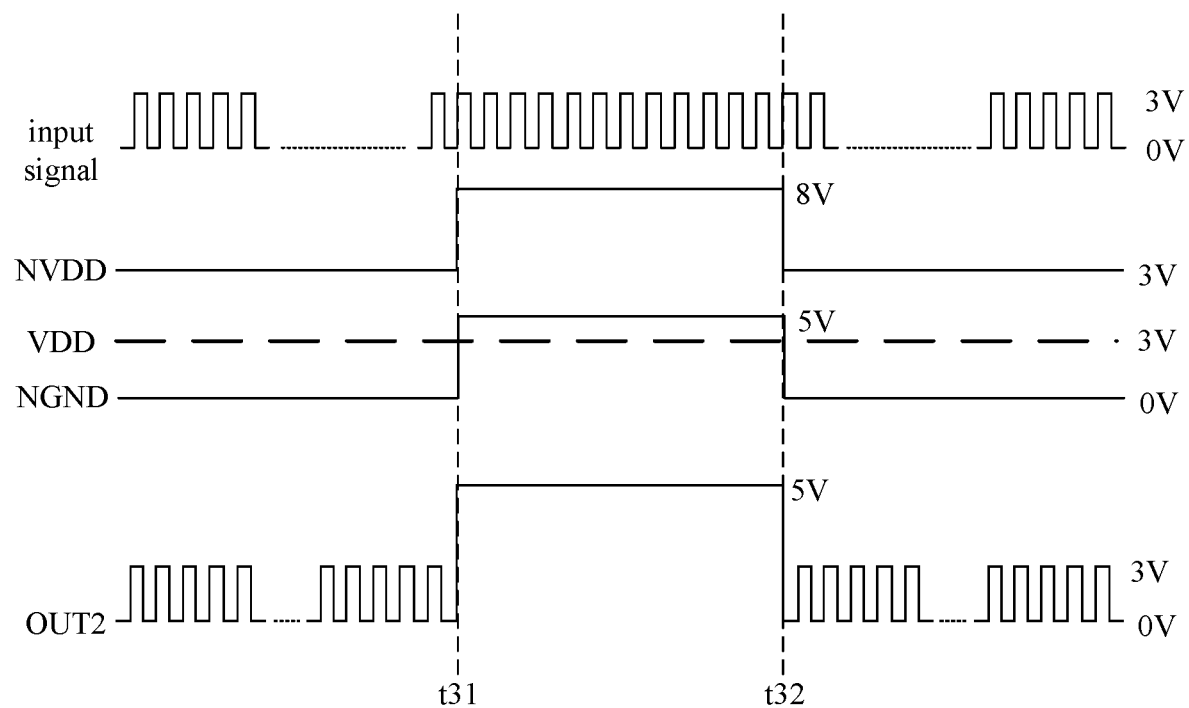
FIG. 6 is a waveform diagram of the structure in FIG. 5.

As shown in FIG. 6, before the instant t31 or after the instant t32, both the voltages of the second low voltage signal NGND and the first low voltage signal GND are 0V and are lower than that of the first high voltage signal VDD which is 3V. Between the instant t31 and the instant t32, the voltage of the second low voltage signal NGND is increased to 5V, and correspondingly, the voltage of the second high voltage signal is increased to 8V from 3V. In this case, the voltage of the second low voltage signal NGND is higher than that of the first high voltage signal VDD and is not equal to that of the first low voltage signal GND which is 0V.

It can be seen from the above timing analysis whether the voltage of the second low voltage signal NGND is equal to that of the first low voltage signal GND may be determined according to whether the voltage of the second low voltage signal NGND is higher than that of the first high voltage signal VDD. Accordingly, the second detection circuit 31 in the embodiment includes a third detection PMOS transistor P31 and a third current source I31.

The source of the third detection PMOS transistor P31 receives the first high voltage signal VDD. The gate of the third detection PMOS transistor P31 receives the second low voltage signal NGND. The drain of the third detection PMOS transistor P31 is connected to a first terminal of the third current source I31 and outputs the detection signal Det. A second terminal of the third current source I31 receives the first low voltage signal GND.

The second transmission circuit 21 includes a second transmission gate 32, a second bias PMOS transistor P36 and a second transmission inverter 321.

A first control terminal of the second transmission gate 32 receives the detection signal Det. A second control terminal of the second transmission gate 32 is connected to an output terminal of the second transmission inverter 321. An input terminal of the second transmission gate 32 receives the input signal. An output terminal of the second transmission gate 32 is connected to the drain of the second bias PMOS transistor P36. The gate of the second bias PMOS transistor P36 receives the detection signal Det. The source of the second bias PMOS transistor P36 receives the second high voltage signal NVDD. The drain of the second bias PMOS transistor P36 is connected to the output terminal OUT2 of the receiving apparatus.

An input terminal of the second transmission inverter 321 may directly receive the detection signal Det (not shown in the figure). The input terminal of the second transmission inverter 321 may also receive the detection signal Det via a second boost circuit 33, thereby, ensuring the second transmission gate 32 to be turn on or off effectively. The second boost circuit 33 will be described in detail hereinafter.

The second transmission gate 32 in the receiving apparatus for a positive voltage mode may include a second transmission PMOS transistor P32 and a second transmission NMOS transistor N32.

The source of the second transmission PMOS transistor P32 is connected to the drain of the second transmission NMOS transistor N32 and functions as the input terminal of the second transmission gate 32. The drain of the second transmission PMOS transistor P32 is connected to the source of the second transmission NMOS transistor N32 and functions as the output terminal of the second transmission gate 32. The gate of the second transmission NMOS transistor N32 functions as the first control terminal of the second transmission gate 32, and the gate of the second transmission PMOS transistor P32 functions as the second control terminal of the second transmission gate 32.

The second transmission circuit 21 may further include a second input inverter 34 and a second output inverter 35.

The input terminal of the second transmission gate 32 receives the input signal of the dual-power system via the second input inverter 34. The output terminal of the second transmission gate 32 is connected to the drain of the second bias PMOS transistor P36 and further connected to the output terminal OUT2 of the receiving apparatus via the second output inverter 35.

The second boost circuit 33 is configured to process the detection signal Det. The input terminal of the second transmission inverter 321 receives a detection signal Ls which has been processed by the second boost circuit.

The second boost circuit 33 may include a first boost PMOS transistor P331, a second boost PMOS transistor P332, a first boost NMOS transistor N331, a second boost NMOS transistor N332, a first boost inverter 331 and a second boost inverter 332.

Both the sources of the first boost PMOS transistor P331 and the second boost PMOS transistor P332 receive the second high voltage signal NVDD. Both the sources of the first boost NMOS transistor N331 and the second boost NMOS transistor N332 receive the first low voltage signal GND.

The gate of the first boost PMOS transistor P331 is connected to the drain of the second boost PMOS transistor P332 and the drain of the second boost NMOS transistor N332. The drain of the first boost PMOS transistor P331 is connected to the gate of the second boost PMOS transistor P332 and the drain of the first boost NMOS transistor N331, and outputs the detection signal Ls which has been processed by the second boost circuit 33.

The gate of the first boost NMOS transistor N331 is connected to an input terminal of the first boost inverter 331 and an output terminal of the second boost inverter 332. The gate of the second boost inverter 332 is connected to an output terminal of the first boost inverter 331.

Both supply terminals of the first boost inverter 331 and the second boost inverter 332 receive the first high voltage signal VDD. An input terminal of the second boost inverter 332 receives the detection signal Det.

Operating processes of the receiving apparatus for a positive voltage mode are described in the following.

In a case that the voltage of the second low voltage signal NGND is lower than that of the first high voltage signal VDD, the third detection PMOS transistor P31 is turned on, the detection signal Det outputted by the second detection circuit 31 is a high level "1" having a voltage equal to that of the first high voltage signal VDD, which indicates that the voltage of the second low voltage signal NGND is equal to that of the first low voltage signal GND.

The detection signal Det causes the second transmission NMOS transistor N32 in the second transmission gate 32 to be turned on, the second bias PMOS transistor P36 to be turned off, the first boost NMOS transistor N331 in the second boost circuit 33 to be turned off, the second boost PMOS transistor P332 in the second boost circuit 33 to be turned off, and the second boost NMOS transistor N332 in the second boost circuit 33 to be turned on. Thus, a gate voltage of the first boost PMOS transistor P331 is equal to the voltage of the first low voltage signal GND, whereby the first boost PMOS transistor P331 is turned on, and a voltage of the detection signal Ls which has been processed by the second boost circuit 33 is equal to that of the second high voltage signal NVDD.

The detection signal Ls which has been processed by the second boost circuit 33 causes the second transmission PMOS transistor P32 in the second transmission gate 32 to be turned on. Since the second transmission PMOS transistor P32 and the second transmission NMOS transistor N32 in the second transmission gate 32 are in the on state, the second transmission gate 32 transmits the input signal of the dual-power system to the output terminal OUT2 of the receiving apparatus.

In a case that the voltage of the second low voltage signal NGND is higher than or equal to that of the first high voltage signal VDD, the third detection PMOS transistor P31 is turned off, and the detection signal Det outputted by the second detection circuit 31 is a low level "0" having a voltage equal to that of the first low voltage signal GND, which indicates that the voltage of the second low voltage signal NGND is not equal to that of the first low voltage signal GND.

The detection signal Det causes the second transmission NMOS transistor N32 in the second transmission gate 32 to be turned off, the second bias PMOS transistor P36 to be turned on, the second boost NMOS transistor N332 in the second boost circuit to be turned off, the first boost PMOS transistor P331 in the second boost circuit to be turned off, and the first boost NMOS transistor N331 in the second boost circuit to be turned on. Thus, a voltage of the detection signal Ls which has been processed by the second boost circuit 33 is equal to that of the first low voltage signal GND.

The detection signal Ls which has been processed by the second boost circuit 33 causes the second transmission PMOS transistor P32 in the second transmission gate 32 to be turned off. Since the second transmission PMOS transistor P32 and the second transmission NMOS transistor N32 in the second transmission gate 32 are in the off state and the second bias PMOS transistor P36 is in the on state, a voltage of the output terminal of the second transmission gate 32 is equal to that of the second high voltage signal NVDD. Thus, the NMOS transistor N35 in the second output inverter 35 is turned on and the PMOS transistor P35 in the second output inverter 35 is turned off, and the voltage of the output terminal OUT2 of the receiving apparatus is equal to that of the second low voltage signal NGND, that is, the second voltage provided by the second transmission circuit 21 is equal to the voltage of the second low voltage signal NGND.

Reference is made to FIG. 6 again. Before the instant t31 or after the instant t32, the voltage of the second low voltage signal NGND is equal to that of the first low voltage signal GND, and the signal of the output terminal OUT2 of the receiving apparatus is the same as the input signal. Between the instant t31 and the instant t32, the voltage of the second low voltage signal NGND is not equal to that of the first low voltage signal GND, and the voltage of the signal of the output terminal OUT2 of the receiving apparatus is equal to that of the second low voltage signal NGND.

The above receiving apparatus of the dual-power system may be connected to one or more sending systems, and the one or more sending systems each may be a single-power system. Specifically, the one or more sending systems are configured to provide the input signal of the dual-power system. The one or more sending systems each may include a third power system, and the third power system is configured to provide a third high voltage signal and a third low voltage signal. A voltage difference between the third high voltage signal and the third low voltage signal is equal to that between the first high voltage signal VDD and the first low voltage signal GND, a voltage of the third high voltage signal is equal to that of the first high voltage signal VDD, and the second voltage is equal to that of the second low voltage signal NGND.

It can be seen from the above that, in a case that the voltage of the second low voltage signal NGND is increased, the receiving apparatus in the embodiment plays a role of isolation, and blocks the one or more receiving systems from the dual-power system, thereby, preventing the one or more single-power sending systems from being damaged.

Figure 7:
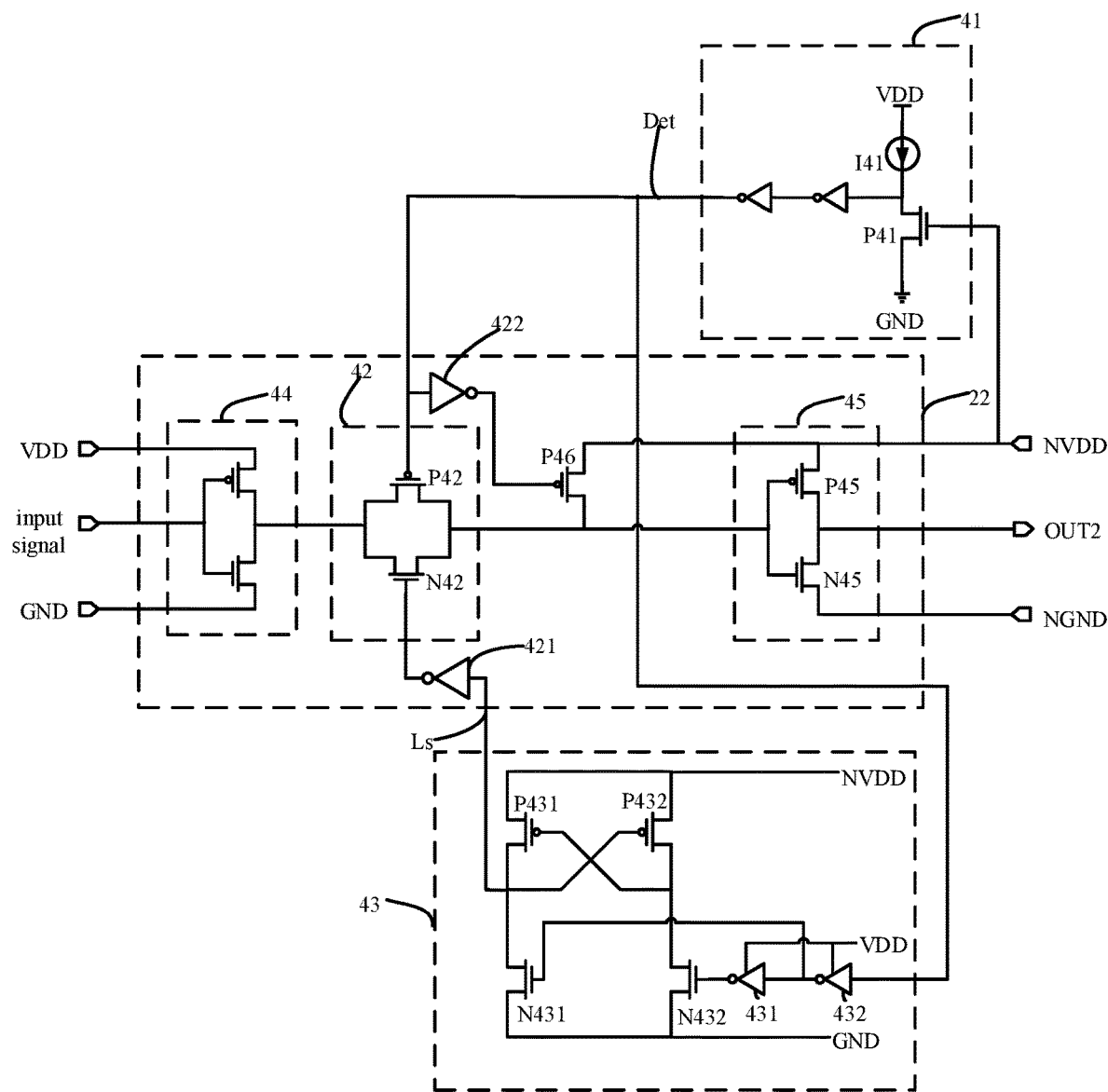
FIG. 7 is a schematic structural diagram of a receiving apparatus in a negative voltage mode according to the present disclosure.

As shown in FIG. 7, a receiving apparatus for a negative voltage mode is provided in the following according to an embodiment. The negative voltage mode refers to a mode in which a second high voltage signal NVDD includes a positive voltage signal and a negative voltage signal.

A dual-power system in the embodiment is connected to an output terminal OUT2 of the receiving apparatus. The structure of the receiving apparatus for a negative voltage mode in the embodiment is similar to that of the receiving apparatus for a positive voltage mode in the previous embodiment, which includes a second detection circuit 41 and a second transmission circuit 22.

The second detection circuit 41 is configured to output a detection signal Det. The detection signal Det indicates whether a voltage of the first low voltage signal GND is equal to that of the second low voltage signal NGND, or whether a voltage of the first high voltage signal VDD is equal to that of the second high voltage signal NVDD.

The second transmission circuit 22 is configured to transmit an input signal of the dual-power system to the output terminal OUT2 of the receiving apparatus or provide a second voltage to the output terminal OUT2 of the receiving apparatus, based on the detection signal Det.

Specifically, in a case that the detection signal Det is a high level "1", it is indicated that the voltage of the first low voltage signal GND is equal to that of the second low voltage signal NGND, or the voltage of the first high voltage signal VDD is equal to that of the second high voltage signal NVDD; and in a case that the detection signal Det is a low level "0", it is indicated that the voltage of the first low voltage signal GND is not equal to that of the second low voltage signal NGND, or the voltage of the first high voltage signal VDD is not equal to that of the second high voltage signal NVDD.

In a case that the voltage of the first low voltage signal GND is equal to that of the second low voltage signal VGND, or the voltage of the first high voltage signal VDD is equal to that of the second high voltage signal NVDD, the input signal is transmitted to the output terminal OUT2 of the receiving apparatus. In a case that the voltage of the first low voltage signal GND is not equal to that of the second low voltage signal VGND, or the voltage of the first high voltage signal VDD is not equal to that of the second high voltage signal NVDD, the second voltage is provided to the output terminal OUT2 of the receiving apparatus.

Figure 8:
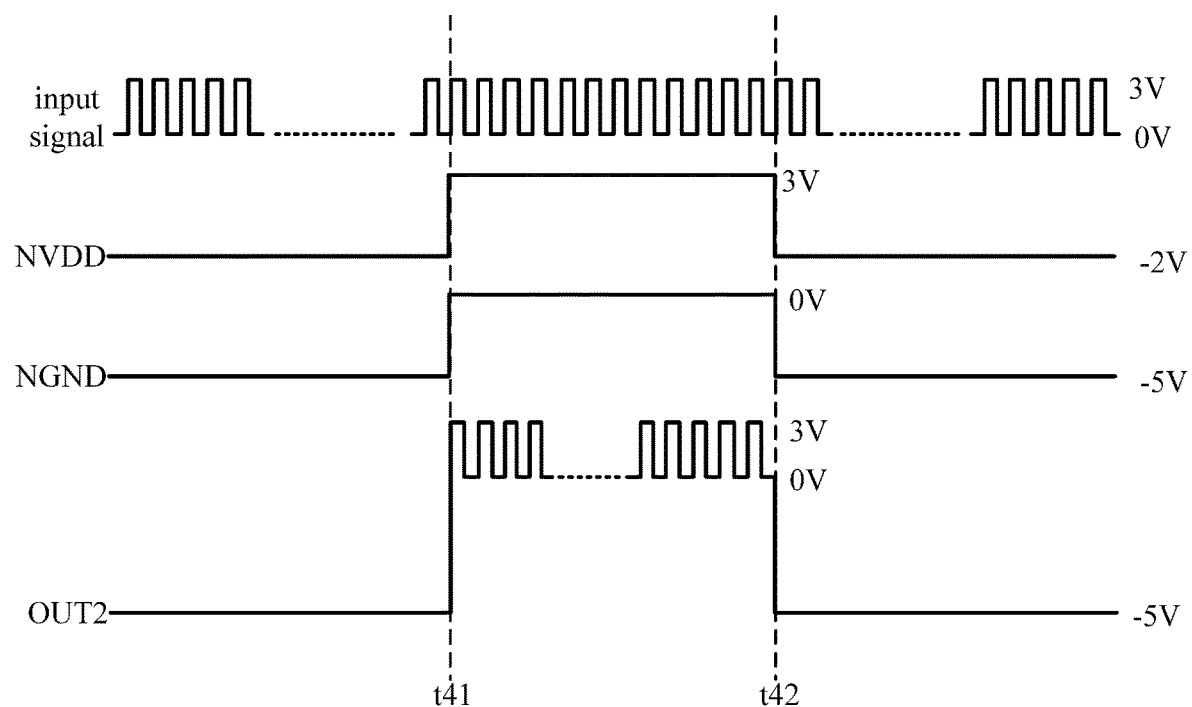
FIG. 8 is a waveform diagram of the structure in FIG. 7.

As shown in FIG. 8, between the instant t41 and the instant t42, both the voltages of the second low voltage signal NGND and the first low voltage signal GND are 0V, and the voltage of the second high voltage signal NVDD which is 3V is higher than that of the first low voltage signal GND which is 0V. Before the instant t41 or after the instant t42, the voltage of the second low voltage signal NGND is reduced to −5V, which is not equal to that of the first low voltage signal GND which is 0V, and correspondingly, the voltage of the second high voltage signal is reduced to −2V from 3V. In this case, the voltage of the second high voltage signal NVDD which is −2V is lower than that of the first low voltage signal GND which is 0V.

It can be seen from the above timing analysis whether the voltage of the second low voltage signal NGND is equal to that of the first low voltage signal GND may be determined according to whether the voltage of the second high voltage signal NVDD is higher than that of the first low voltage signal GND. Accordingly, the second detection circuit 41 in the embodiment includes a fourth detection NMOS transistor P41 and a fourth current source I41.

A first terminal of the fourth current source I41 receives the first high voltage signal VDD, and a second terminal of the fourth current source I41 is connected to the drain of the fourth detection NMOS transistor P41 and outputs the detection signal Det. The gate of the fourth detection NMOS transistor P41 receives the second high voltage signal NVDD, and the source of the second detection NMOS transistor P41 receives the first low voltage signal GND.

The second transmission circuit 22 includes a second transmission gate 42, a second bias PMOS transistor P46 and a second transmission inverter 421.

A first control terminal of the second transmission gate 42 receives the detection signal Det. A second control terminal of the second transmission gate 42 is connected to an output terminal of the second transmission inverter 421. An input terminal of the second transmission gate 42 receives the input signal. An output terminal of the transmission gate 22 is connected to the drain of the second bias PMOS transistor P46.

The gate of the second bias PMOS transistor P46 receives an inversion signal of the detection signal Det. In the embodiment, an inverter 422 is configured to invert a phase of the detection signal Det. The source of the second bias PMOS transistor P46 receives the second high voltage signal NVDD. The drain of the second bias PMOS transistor P46 is connected to the output terminal OUT2 of the receiving apparatus.

An input terminal of the second transmission inverter 421 may directly receive the detection signal Det (not shown in the figure). The second transmission inverter 421 may also receive the detection signal Det via a second boost circuit 43, thereby, ensuring the second transmission gate 42 to be turn on or off effectively. The second boost circuit 43 will be described in detail hereinafter.

The second transmission gate 42 in the receiving apparatus for a negative voltage mode may include a second transmission PMOS transistor P42 and a second transmission NMOS transistor N42.

The source of the second transmission PMOS transistor P42 is connected to the drain of the second transmission NMOS transistor N42 and functions as the input terminal of the second transmission gate 42. The drain of the second transmission PMOS transistor P42 is connected to the source of the second transmission NMOS transistor N42 and functions as the output terminal of the second transmission gate 42. The gate of the second transmission PMOS transistor P42 functions as the first control terminal of the second transmission gate 42, and the gate of the second transmission NMOS transistor N42 functions as the second control terminal of the second transmission gate 42.

The second transmission circuit 22 may further include a second input inverter 44 and a second output inverter 45.

The input terminal of the second transmission gate 42 receives the input signal via the second input inverter 44. The output terminal of the second transmission gate 42 is connected to the drain of the second bias PMOS transistor P46 and further connected to the output terminal OUT2 of the receiving apparatus via the second output inverter 45.

The second boost circuit 43 is configured to process the detection signal Det. The input terminal of the second transmission inverter 421 receives a detection signal Ls which has been processed by the second boost circuit 43.

The second boost circuit 43 may include a first boost PMOS transistor P431, a second boost PMOS transistor P432, a first boost NMOS transistor N431, a second boost NMOS transistor N432, a first boost inverter 431 and a second boost inverter 432. The structure of the second boost circuit 43 is the same as that of the second boost circuit 33 in the previous embodiment, and reference can be made to FIG. 7 and the corresponding section in the previous embodiment for detailed description.

Operating processes of the receiving apparatus for a negative voltage mode are described in the following.

In a case that the voltage of the second high voltage signal NVDD is lower than that of the first low voltage signal GND, the fourth detection PMOS transistor P41 is turned off, and the detection signal Det outputted by the second detection circuit 41 is a high level "1" having a voltage equal to that of the first high voltage signal VDD, which indicates that the voltage of the second low voltage signal NGND is not equal to that of the first low voltage signal GND.

The detection signal Det causes the first transmission PMOS transistor P42 in the second transmission gate 42 to be turned off, the second bias PMOS transistor P46 to be turned on, the second boost NMOS transistor N432 in the second boost circuit 43 to be turned on, the first boost PMOS transistor P431 in the second boost circuit 43 to be turned on; the first boost NMOS transistor N431 in the second boost circuit 43 to be turned off, and the second boost NMOS transistor P432 in the second boost circuit 43 to be turned off. Thus, the voltage of the detection signal Ls which has been processed by the second boost circuit 43 is equal to that of the second high voltage signal NVDD.

The detection signal Ls which has been processed by the second boost circuit 43 causes the second transmission NMOS transistor N42 in the second transmission gate 42 to be turned off. Since the second transmission PMOS transistor P42 and the second transmission NMOS transistor N42 in the second transmission gate 42 are in the off state, and the second bias PMOS transistor P46 is in the on state, the voltage of the output terminal of the second transmission gate 42 is equal to that of the second high voltage signal NVDD. Thus, the NMOS transistor N45 in the second output inverter 45 is turned on and the PMOS transistor P45 in the second output inverter 45 is turned on, and the voltage of the output terminal OUT2 of the receiving apparatus is equal to that of the second low voltage signal NGND, that is, the second voltage provided by the second transmission circuit 22 is equal to the voltage of the second low voltage signal NGND.

In a case that the voltage of the second high voltage signal NVDD is higher than that of the first low voltage signal GND, the fourth detection PMOS transistor P41 is turned on, and the detection signal Det outputted by the second detection circuit 41 is a low level "0" having a voltage equal to that of the first low voltage signal GND, which indicates that the voltage of the second low voltage signal NGND is equal to that of the first low voltage signal GND.

The detection signal Det causes the second transmission PMOS transistor P42 in the second transmission gate 42 to be turned off, the second bias PMOS transistor P46 to be turned off, the second boost NMOS transistor N432 in the second boost circuit 43 to be turned off, the first boost PMOS transistor P431 in the second boost circuit 43 to be turned off, and the first boost NMOS transistor N431 in the second boost circuit 43 to be turned on. Thus, a voltage of the detection signal Ls which has been processed by the second boost circuit 43 is equal to that of the first low voltage signal GND.

The detection signal Ls which has been processed by the second boost circuit 43 causes the second transmission NMOS transistor N42 in the second transmission gate 42 to be turned on. Thus, the second transmission gate 42 transmits the input signal to an input terminal IN.

Reference is made to FIG. 8 again. Between the instant t41 and the instant t42, the voltage of the second low voltage signal NGND is equal to that of the first low voltage signal GND, and a signal of the output terminal OUT2 of the receiving apparatus is the same as the input signal of the dual-power system. Before the instant t41 or after the instant t42, the voltage of the second low voltage signal NGND is not equal to that of the first low voltage signal GND, and a voltage of the signal of the output terminal OUT2 of the receiving apparatus is equal to that of the second low voltage signal NGND.

Similar to the previous embodiment, the receiving apparatus in the embodiment may also be connected to one or more single-power sending systems.

In the embodiment, in a case that the voltage of the second low voltage signal NGND is increased (the absolute value of the voltage is increased), the receiving apparatus in the embodiment plays a role of isolation, and blocks the one or more sending systems from the dual-power system, thereby, preventing the one or more sending systems from being damaged.

A transmitting apparatus of a dual-power system is further provided according to an embodiment of the present disclosure, which includes the sending apparatus according to the above embodiments and one or more receiving systems. Each of the one or more receiving systems is connected to a signal output terminal of the sending apparatus, and a supply voltage of each of the one or more receiving systems is higher than or equal to the first voltage.

Another transmitting apparatus of a dual-power system is further provided according to an embodiment of the present disclosure, which includes one or more sending systems and the receiving apparatus according to the above embodiments. Each of the one or more sending systems is configured to provide an input signal of the dual-power system.

A fingerprint recognition system is further provided according to an embodiment of the present disclosure, which includes a dual-power system and the transmitting apparatus according to the above embodiment. The dual-power system is configured to provide an output signal of the dual-power system to the input terminal of the sending apparatus. Or, the dual-power system is connected to the output terminal of the receiving apparatus.

The invention is not limited to the disclosure above. Various changes and modifications may be made by those skilled in the art without departing from the spirit or scope of the present disclosure. Therefore, the scope of the invention is best determined by the appended claims.

The invention claimed is:

1. A sending apparatus of a dual-power system, wherein the dual-power system comprises a first power system and a second power system, the first power system is configured to provide a first high voltage signal and a first low voltage signal, the second power system is configured to provide a second high voltage signal and a second low voltage signal, and a voltage difference between the first high voltage signal and the first low voltage signal is equal to that between the second high voltage signal and the second low voltage signal, and wherein the sending apparatus comprises:
a first detection circuit, configured to output a detection signal, wherein the detection signal indicates whether a voltage of the first low voltage signal is equal to that of the second low voltage signal, or whether a voltage of the first high voltage signal is equal to that of the second high voltage signal; and
a first transmission circuit, configured to transmit an output signal of the dual-power system to an output terminal of the sending apparatus or provide a first voltage to the output terminal of the sending apparatus, based on the detection signal.

2. The sending apparatus according to claim 1, wherein the output signal of the dual-power system is transmitted to the output terminal of the sending apparatus, in a case that the voltage of the first low voltage signal is equal to that of the second low voltage signal or the voltage of the first high voltage signal is equal to that of the second high voltage signal; and
the first voltage is provided to the output terminal of the sending apparatus, in a case that the voltage of the first low voltage signal is not equal to that of the second low voltage signal or the voltage of the first high voltage signal is not equal to that of the second high voltage signal.

3. The sending apparatus according to claim 1, wherein the second high voltage signal is a positive voltage signal all the time, and the first detection circuit comprises a first detection PMOS transistor and a first current source; wherein,
the source of the first detection PMOS transistor receives the first high voltage signal, the gate of the first detection PMOS transistor receives the second low voltage signal, and the drain of the first detection PMOS transistor is connected to a first terminal of the first current source and outputs the detection signal; and
the first current source has a second terminal for receiving the first low voltage signal.

4. The sending apparatus according to claim 1, wherein the second high voltage signal comprises a positive voltage signal and a negative voltage signal, and the first detection circuit comprises a second detection NMOS transistor and a second current source; wherein,
the second current source has a first terminal for receiving the first high voltage signal, and a second terminal which is connected to the drain of the second detection NMOS transistor and outputs the detection signal; and
the gate of the second detection NMOS transistor receives the second high voltage signal, and the source of the second detection NMOS transistor receives the first low voltage signal.

5. The sending apparatus according to claim 1, wherein the first transmission circuit comprises a first transmission gate, a first bias PMOS transistor and a first transmission inverter; wherein,
- the first transmission gate has a first control terminal for receiving the detection signal, a second control terminal connected to an output terminal of the first transmission inverter, an input terminal for receiving the output signal of the dual-power system, and an output terminal connected to the drain of the first bias PMOS transistor;
- the gate of the first bias PMOS transistor receives the detection signal or an inversion signal of the detection signal, the source of the first bias PMOS transistor receives the first high voltage signal, and the drain of the first bias PMOS transistor is connected to the output terminal of the sending apparatus; and
- the first transmission inverter has an input terminal for receiving the detection signal.

6. The sending apparatus according to claim 5, further comprising a first boost circuit; wherein,
- the first boost circuit is configured to process the detection signal, and
- the input terminal of the first transmission inverter receives a detection signal which has been processed by the first boost circuit.

7. The sending apparatus according to claim 6, wherein the second high voltage signal is a positive voltage signal all the time, and the first transmission gate comprises a first transmission PMOS transistor and a first transmission NMOS transistor; wherein,
- the source of the first transmission PMOS transistor is connected to the drain of the first transmission NMOS transistor and functions as the input terminal of the first transmission gate;
- the drain of the first transmission PMOS transistor is connected to the source of the first transmission NMOS transistor and functions as the output terminal of the first transmission gate;
- the gate of the first transmission NMOS transistor functions as the first control terminal of the first transmission gate; and
- the gate of the first transmission PMOS transistor functions as the second control terminal of the first transmission gate.

8. The sending apparatus according to claim 6, wherein the second high voltage signal comprises a positive voltage signal and a negative voltage signal, and the first transmission gate comprises a first transmission PMOS transistor and a first transmission NMOS transistor; wherein,
- the source of the first transmission PMOS transistor is connected to the drain of the first transmission NMOS transistor and functions as the input terminal of the first transmission gate;
- the drain of the first transmission PMOS transistor is connected to the source of the first transmission NMOS transistor and functions as the output terminal of the first transmission gate;
- the gate of the first transmission PMOS transistor functions as the first control terminal of the first transmission gate; and
- the gate of the first transmission NMOS transistor functions as the second control terminal of the first transmission gate.

9. The sending apparatus according to claim 6, wherein the first boost circuit comprises a first boost PMOS transistor, a second boost PMOS transistor, a first boost NMOS transistor, a second boost NMOS transistor, a first boost inverter and a second boost inverter; wherein,
- the sources of the first boost PMOS transistor and the second boost PMOS transistor receive the second high voltage signal, and the sources of the first boost NMOS transistor and the second boost NMOS transistor receive the first low voltage signal;
- the gate of the first boost PMOS transistor is connected to the drain of the second boost PMOS transistor and the drain of the second boost NMOS transistor, the drain of the first boost PMOS transistor is connected to the gate of the second boost PMOS transistor and the drain of the first boost NMOS transistor, and the gate of the second boost PMOS transistor outputs the detection signal which has been processed by the first boost circuit;
- the gate of the first boost NMOS transistor is connected to an input terminal of the first boost inverter and an output terminal of the second boost inverter, and the gate of the second boost inverter is connected to an output terminal of the first boost inverter; and
- supply terminals of the first boost inverter and the second boost inverter receive the first high voltage signal, and an input terminal of the second boost inverter receives the detection signal.

10. The sending apparatus according to claim 5, wherein the first transmission circuit further comprises a first input inverter and a first output inverter; wherein,
- the input terminal of the first transmission gate receives the output signal via the first input inverter, and the output terminal of the first transmission gate is connected to the drain of the first bias PMOS transistor and further connected to the output terminal of the sending apparatus via the first output inverter.

11. A receiving apparatus of a dual-power system, wherein the dual-power system comprises a first power system and a second power system, the first power system is configured to provide a first high voltage signal and a first low voltage signal, the second power system is configured to provide a second high voltage signal and a second low voltage signal, and a voltage difference between the first high voltage signal and the first low voltage signal is equal to that between the second high voltage signal and the second low voltage signal, and
wherein the receiving apparatus comprises:
- a second detection circuit, configured to output a detection signal, wherein the detection signal indicates whether a voltage of the first low voltage signal is equal to that of the second low voltage signal, or whether a voltage of the first high voltage signal is equal to that of the second high voltage signal; and
- a second transmission circuit, configured to transmit an input signal of the dual-power system to an output terminal of the receiving apparatus or provide a second voltage to the output terminal of the receiving apparatus, based on the detection signal.

12. The receiving apparatus according to claim 11, wherein the input signal of the dual-power system is transmitted to the output terminal of the receiving apparatus, in a case that the voltage of the first low voltage signal is equal to that of the second low voltage signal or the voltage of the first high voltage signal is equal to that of the second high voltage signal; and
- the second voltage is provided to the output terminal of the receiving apparatus, in a case that the voltage of the first low voltage signal is not equal to that of the second low voltage signal or the voltage of the first high voltage signal is not equal to that of the second high voltage signal.

13. The receiving apparatus according to claim 11, wherein the second high voltage signal is a positive voltage signal all the time, and the second detection circuit comprises a third detection PMOS transistor and a third current source; wherein,
   the source of the third detection PMOS transistor receives the first high voltage signal, the gate of the third detection PMOS transistor receives the second low voltage signal, and the drain of the third detection PMOS transistor is connected to a first terminal of the third current source and outputs the detection signal; and
   the third current source has a second terminal for receiving the first low voltage signal.

14. The receiving apparatus according to claim 11, wherein the second high voltage signal comprises a positive voltage signal and a negative voltage signal, and the second detection circuit comprises a fourth detection NMOS transistor and a fourth current source; wherein,
   the fourth current source has a first terminal for receiving the first high voltage signal, and a second terminal which is connected to the drain of the fourth detection NMOS transistor and outputs the detection signal; and
   the gate of the fourth detection NMOS transistor receives the second high voltage signal, and the source of the fourth detection NMOS transistor receives the first low voltage signal.

15. The receiving apparatus according to claim 11, wherein the second transmission circuit comprises a second transmission gate, a second bias PMOS transistor and a second transmission inverter; wherein,
   the second transmission gate has a first control terminal for receiving the detection signal, a second control terminal connected to an output terminal of the second transmission inverter, an input terminal for receiving the input signal, and an output terminal connected to the drain of the second bias PMOS transistor;
   the gate of the second bias PMOS transistor receives the detection signal or an inversion signal of the detection signal, the source of the second bias PMOS transistor receives the second high voltage signal, and the drain of the second bias PMOS transistor is connected to the output terminal of the receiving apparatus; and
   the second transmission inverter has an input terminal for receiving the detection signal.

16. The receiving apparatus according to claim 15, further comprising a second boost circuit; wherein,
   the second boost circuit is configured to process the detection signal, and
   the input terminal of the second transmission inverter receives a detection signal which has been processed by the second boost circuit.

17. The receiving apparatus according to claim 16, wherein the second high voltage signal is a positive voltage signal all the time, and the second transmission gate comprises a second transmission PMOS transistor and a second transmission NMOS transistor; wherein,
   the source of the second transmission PMOS transistor is connected to the drain of the second transmission NMOS transistor and functions as the input terminal of the second transmission gate;
   the drain of the second transmission PMOS transistor is connected to the source of the second transmission NMOS transistor and functions as the output terminal of the second transmission gate;
   the gate of the second transmission NMOS transistor functions as the first control terminal of the second transmission gate; and
   the gate of the second transmission PMOS transistor functions as the second control terminal of the second transmission gate.

18. The receiving apparatus according to claim 16, wherein the second high voltage signal comprises a positive voltage signal and a negative voltage signal, and the second transmission gate comprises a second transmission PMOS transistor and a second transmission NMOS transistor; wherein,
   the source of the second transmission PMOS transistor is connected to the drain of the second transmission NMOS transistor and functions as the input terminal of the second transmission gate;
   the drain of the second transmission PMOS transistor is connected to the source of the second transmission NMOS transistor and functions as the output terminal of the second transmission gate;
   the gate of the second transmission PMOS transistor functions as the first control terminal of the second transmission gate; and
   the gate of the second transmission NMOS transistor functions as the second control terminal of the second transmission gate.

19. The receiving apparatus according to claim 16, wherein the second boost circuit comprises a first boost PMOS transistor, a second boost PMOS transistor, a first boost NMOS transistor, a second boost NMOS transistor, a first boost inverter and a second boost inverter; wherein,
   the sources of the first boost PMOS transistor and the second boost PMOS transistor receive the second high voltage signal, and the sources of the first boost NMOS transistor and the second boost NMOS transistor receive the first low voltage signal;
   the gate of the first boost PMOS transistor is connected to the drain of the second boost PMOS transistor and the drain of the second boost NMOS transistor, the drain of the first boost PMOS transistor is connected to the gate of the second boost PMOS transistor and the drain of the first boost NMOS transistor, and the gate of the second boost PMOS outputs the detection signal which has been processed by the second boost circuit;
   the gate of the first boost NMOS transistor is connected to an input terminal of the first boost inverter and an output terminal of the second boost inverter, and the gate of the second boost inverter is connected to an output terminal of the first boost inverter; and
   supply terminals of the first boost inverter and the second boost inverter receive the first high voltage signal, and an input terminal of the second boost inverter receives the detection signal.

20. The receiving apparatus according to claim 15, wherein the second transmission circuit further comprises a second input inverter and a second output inverter; wherein,
   the input terminal of the second transmission gate receives the output signal via the second input inverter, and the output terminal of the second transmission gate is connected to the drain of the second bias PMOS transistor and further connected to the output terminal of the receiving apparatus via the second output inverter.

21. A transmitting apparatus of a dual-power system, comprising one or more receiving systems and the sending apparatus according to claim 1, wherein each of the one or more receiving systems is connected to the output terminal of the sending apparatus, and a supply voltage of each of the one or more receiving systems is higher than or equal to the first voltage.

22. A transmitting apparatus of a dual-power system, comprising one or more sending systems and the receiving apparatus according to claim 11, wherein each of the one or more sending systems is configured to provide an input signal of the dual-power system.

23. A fingerprint recognition system, comprising a dual-power system and the transmitting apparatus according to claim 21, wherein the dual-power system is configured to provide an output signal of the dual-power system to an input terminal of the sending apparatus.

24. A fingerprint recognition system, comprising a dual-power system and the transmitting apparatus according to claim 22, wherein the dual-power system is connected to the output terminal of the receiving apparatus.

* * * * *